US005836004A

United States Patent [19]

Jiang et al.

[11] Patent Number: 5,836,004

[45] Date of Patent: Nov. 10, 1998

[54] DIFFERENTIAL MODE TIME TO DIGITAL CONVERTER

[75] Inventors: Miin-Hwa Jiang; Hen-Wai Tsao; Lin-Chieh Chen, all of Taipei, Taiwan

[73] Assignee: Industrial Technology Research Institute, Hsinchu, Taiwan

[21] Appl. No.: 779,557

[22] Filed: Jan. 7, 1997

[51] Int. Cl.[6] ...................... H03M 1/50

[52] U.S. Cl. ...................... 341/166

[58] Field of Search ...................... 341/166, 167, 341/118, 157

[56] References Cited

U.S. PATENT DOCUMENTS

| | | | |
|---|---|---|---|
| 4,887,085 | 12/1989 | Moyal | 341/169 |
| 5,189,313 | 2/1993 | Garuts | 327/170 |

FOREIGN PATENT DOCUMENTS

| | | |
|---|---|---|
| 96-478937 | 4/1996 | European Pat. Off. . |
| 0740234 | 10/1996 | European Pat. Off. . |
| 698219 | 1/1968 | Italy . |
| 97-329583 | 11/1995 | Japan . |

*Primary Examiner*—Howard L. Williams
*Attorney, Agent, or Firm*—Bacon & Thomas

[57] ABSTRACT

A differential mode time to digital converter uses a pair of symmetric capacitors and a pair of constant currents to generate two charging curves with the same characteristics. By charging the capacitors at different timings to produce a voltage difference between the capacitors, and then holding and amplifying the voltage difference, a relationship between time and the digital signal is obtained, thereby reducing the effects of temperature on the electronic element and providing a high noise immunity, short conversion time, and high linearity.

3 Claims, 5 Drawing Sheets

DIFFERENTIAL MODE TIME TO DIGITAL CONVERTER

BACKGROUND OF THE INVENTION

1. Field of the Invention

The present invention relates to the structure of a time to digital converter, and especially, a differential mode time to digital converter, wherein by using a pair of constant currents to charge the capacitors at different timings, a voltage difference between the capacitors is generated, and the relation between time and the digital signal is obtained by using an analog to digital converter.

2. Description of the Prior Art

Time to digital conversion (TDC) is widely used in application such as time domain reflectometer for measuring the reflecting condition in signal paths, a digital scope for random sampling, a radar for military searching, a semiconductor analyzer for measuring the timing relation in the integrated circuit industry, a commonly used analog to digital conversion, a precision instrument for measuring a variety of physics phenomenon, a laser range finder for finding ranges, counters for measuring tiny time differences, etc.

Because TDC is widely used in the industry, there are many embodiments in the prior art, each of which have specific viewpoints and characteristics so the designer may design their product according to the application requirements. All prior embodiments share the following considerations:

(1) high resolution;

(2) high stability to reduce environmental interferences;

(3) wide measuring range;

(4) short conversion time;

(5) preferred linearity;

(6) smaller volume;

(7) low cost.

Of course, it is difficult to provide a design in which all the items listed above have been optimized. Some generally used designs are as follows:

(1) Dual slope method: The gain ratio of TDC is determined by the charge and discharge characteristics of a single capacitor through properly controlling the charge and discharge current. However, due to the instability induced from the capacitance variation by the environment, not only is the precision the affected, but this method has the defects that the gain ratio is too large, the conversion takes a longtime, and the recovery time for the next measurement is also prolonged. These are the defects of the dual slope method.

(2) Time to amplitude conversion method: The capacitor is charged by a current source and the variation in charge is responsive to the voltage change. The voltage is converted into a digital signal for obtaining the relation between time and digital signal. High processing speed is the advantage of this method, but the precision thereof is still determined by the stability of capacitor, and since the analog to digital converter will generate noise to the circuit, the accuracy is limited.

(3) Unit delay buffer method: Since a certain delay will occur in a digital buffer, during the manufacturing process of integrated circuit a plurality of buffers are cascaded, so that after inputting predetermined pulses, a tiny time difference will be identified to form the output signal of each buffer and attain the object of measurement. However, not only is this circuit very complicated, but also the potential jitters occurring in each buffer will have a large effect on the precision of said measurement.

SUMMARY OF THE INVENTION

From the description hereinabove, it will be appreciated that the circuit structure of the time to digital converter still has some disadvantages such as poor precision, longer conversion time and temperature drift. Accordingly, the inventor of the present invention has designed a brand-new differential mode time to digital converter which has the advantages of low noise, high conversion speed and high linearity, and the circuit structure thereof is much simpler than that of the prior art.

In the differential mode time to digital converter of the present invention, a pair of capacitors are charged by a pair of currents upon receiving a trigger signal and a clock signal, thereby generating a voltage difference, the voltage difference being amplified by an instrument amplifier, and a relationship between time and digital signal is obtained by a analog to digital converter.

Since a symmetric structure is adopted by the present invention, the effect of temperature on the capacitors and current source may be canceled by properly selecting mutually coupled components, and furthermore, if properly arranged, the effects of the noise induced by connecting the digital signal and the transient voltage during the instantaneous electronically switching of the two capacitors are all the same, so that the obtained voltage result by transient phenomenon is small, and thus the noice immunity is improved. Because the charge relation of the current source versus the capacitor is not strictly linear, in practice the nonlinear section may be avoided, and the linearity section is selected for matching the requirement of an approximated linear eliminating the need for additional curve fitting procedures.

In summary, the object of the present invention is provided a symmetric structure which may be used to cancel the effects of noise, temperature, etc. and meanwhile the object of high conversion speed, simple structure and preferred linearity are achieved.

BRIEF DESCRIPTION OF THE DRAWINGS

The invention, as well as its many advantages, may be further understood by the following description and drawings in which.

DETAILED DESCRIPTION OF THE PREFERRED EMBODIMENT

Figure 1:
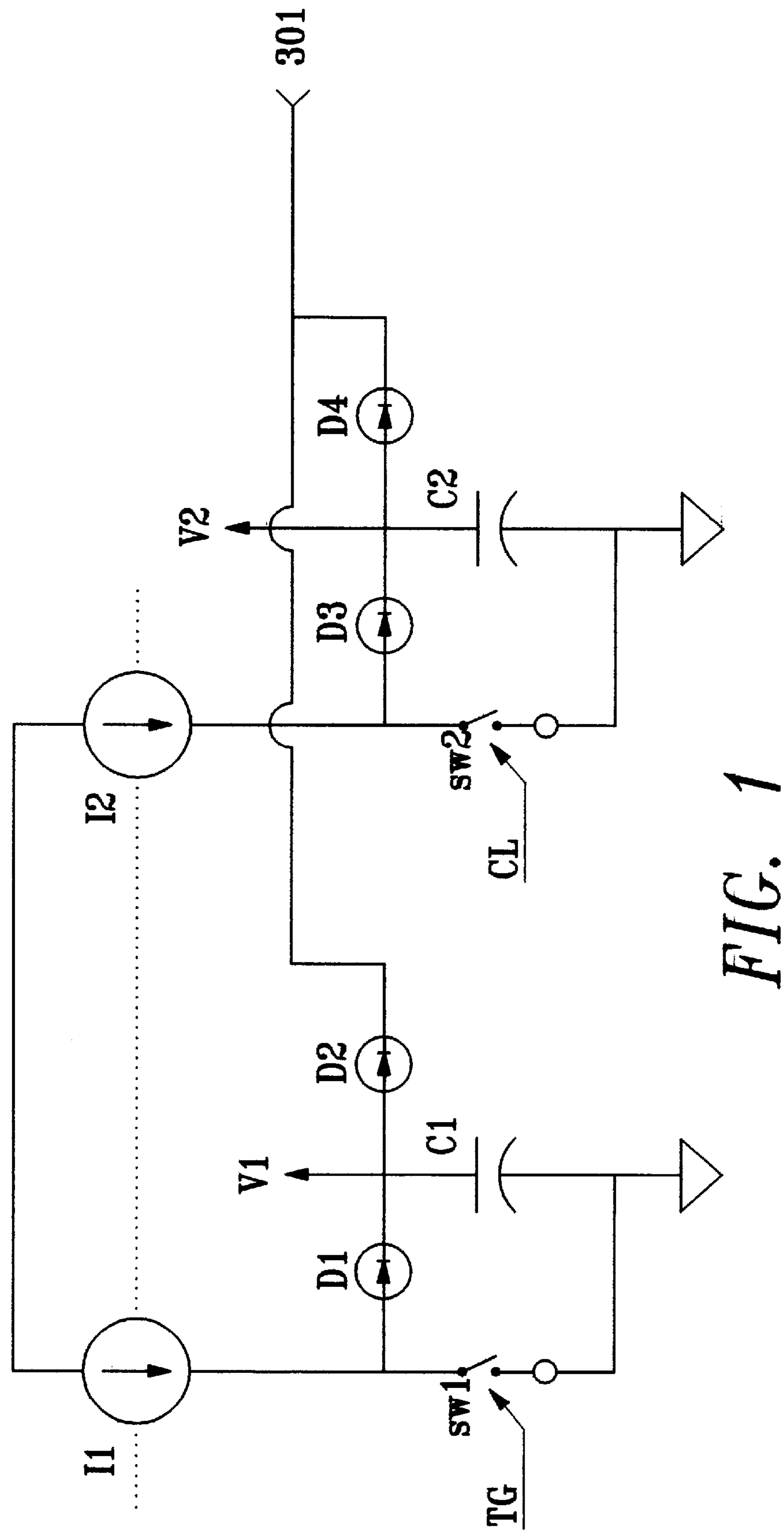
FIG. 1 is a diagram of the circuit structure of a symmetric constant current capacitors pair of the differential mode time to digital converter in the present invention.

The differential mode time to digital converter of the present invention accounts for the effects of noises, temperature stability, and jitter, and the objects of short conversion time, simple structure and preferred linearity are also attained. A pair of symmetric constant current capacitors C1 and C2 are adapted in the present invention, to provide symmetric currents I1 and I2. The charging and discharging of the capacitors are controlled by a trigger signal (TG), a clock signal (CL) and four diodes D1, D2, D3, and D4. The circuit structure is depicted in FIG. 1.

Figure 2:
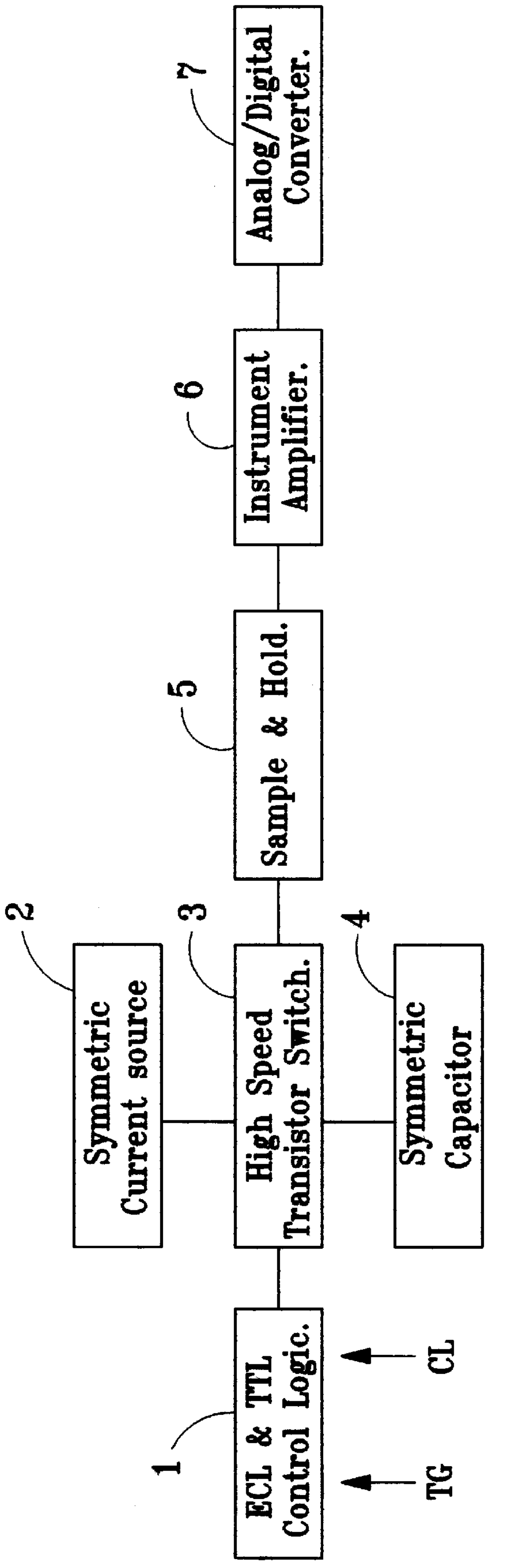
FIG. 2 is a functional block diagram of the differential mode time to digital converter in the present invention.

Now referring to FIG. 2, which shows the circuit block structure of the differential mode time to digital converter of the present invention, wherein charging of a pair of symmetric capacitors 4 via a symetric current source pair 2 is determined by two high speed transistor switches 3 controlled by a ECL and TTL control logic 1 structure, so that the trigger signal TG and the clock signal CL are not charged simultaneously, and the generated voltage being sampled and held by element 5, and then amplified by an instrument amplifier 6, and the relation between time and digital signal being obtained by an analog to digital converter 7.

Figure 3:
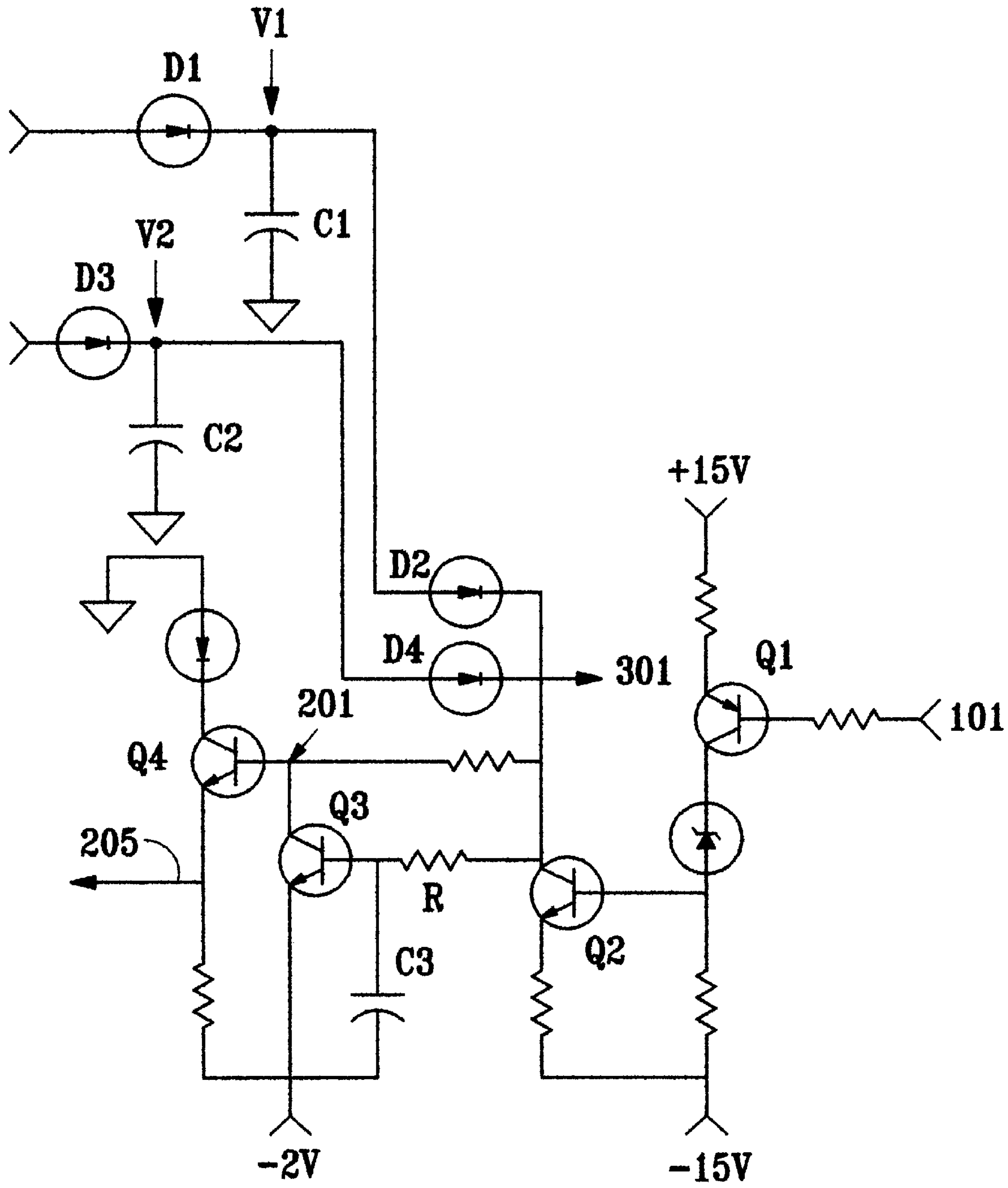
FIG. 3 is a circuit diagram of the integration of control signal and level conversion.

FIG. 3 shows the circuit for the integration and level conversion of the control signal. A start signal 101 is provided by a microprocessor and other digital output ports. When the level is high (1), the transistor Q1 is not conductive so that the transistor Q2 is also not conductive, and thus the signal 301 is raised to 14 V and is connected with the cathode of diodes D2 and D4, as a result of which both the capacitors C1 and C2 are ready to be charged and the levels of signals 201 and 205 are high. The control signal is reset, and simultaneously circuit RC3 is charged to 14 V so as to render conductive the transistor Q3, the signal 201 is decreases to a low level, the transistor Q4 is rendered not conductive, finally the signal 205 is down to a low level (−2 V). Thus the high level time of signal 205 is determined by the aforementioned procedure so the a pulse is generated, i.e. a reset time. The value of RC3 may be adjusted in accordance with various characteristics of the control circuit to match the specific reset requirement so to generate the signal 205, From the description hereinbefore, after the differential mode time to digital converter of the present invention is actuated, in the first section of the time period a function of reset control logic signal is generated automatically by the circuit shown in FIG. 3, and when the signal 101 is returned to a low level, i.e. "0", because the transistor Q1 is actuated and the transistor Q2 is also actuated, the signal 301 is raised to about −2 V to allow the capacitors C1 and C2 to be discharged.

Figure 4:
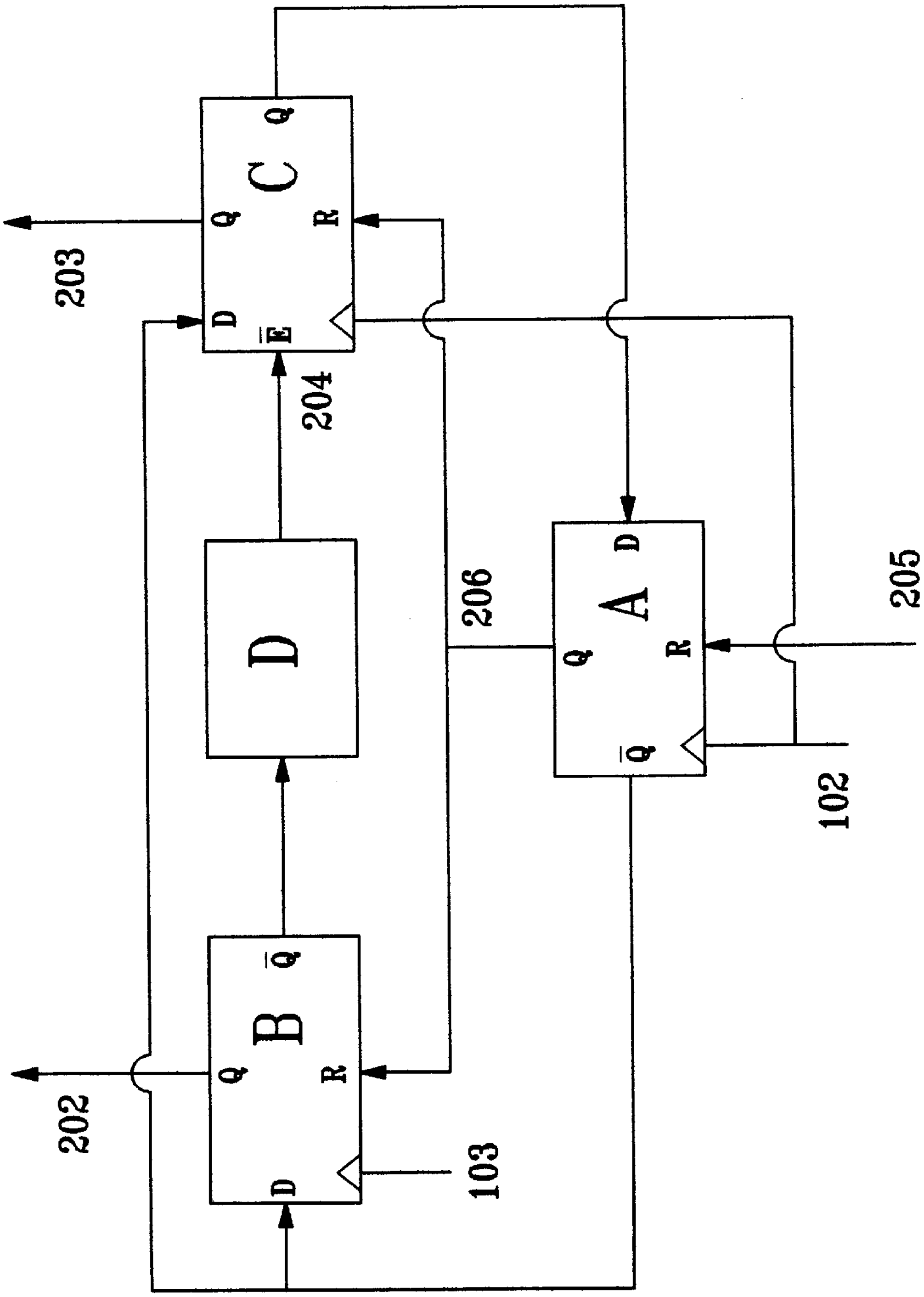
FIG. 4 is a control circuit block diagram of the differential mode time to digital converter in the present invention.
Figure 5:
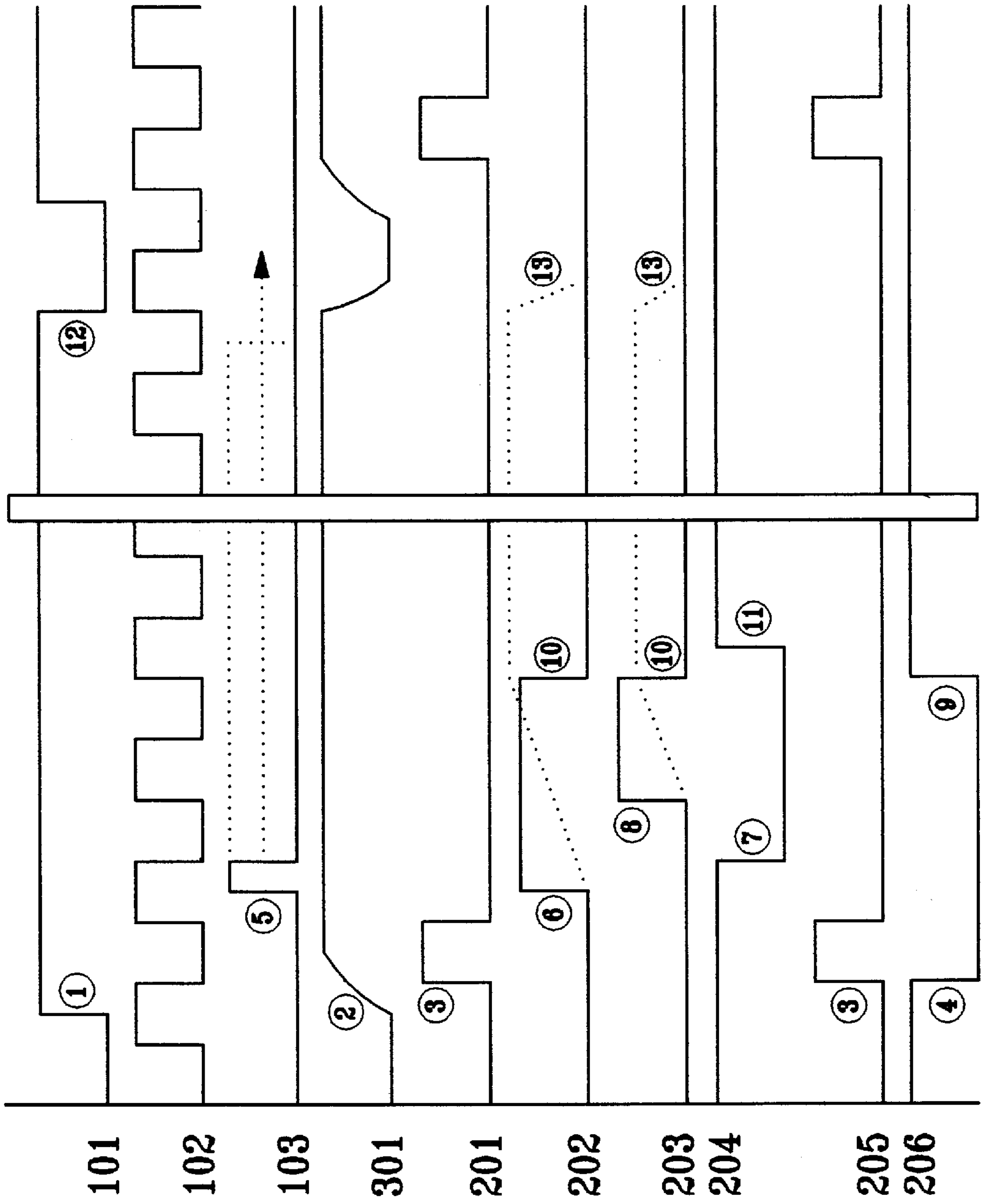
FIG. 5 is a timing diagram of the differential mode time to digital converter in the present invention.

FIG. 4 shows a block diagram of the control circuit of the present invention (ECL control logic), the processing timing of which may be read out with respect to the timing of FIG. 5. The signal 101 being at a high level (timing 1), indicates that the time interval between trigger TG and clock CL will be measured by the TDC circuit. The diodes D1, D2, D3 and D4 are used to hold and discharge the capacitors C1 and C2. When the potential of the terminal 301 is raised from the negative low level to 14 V (timing 2), the charge is held within the capacitors C1 and C2 for storing the current from a current source. Meanwhile, the trigger switch and the clock switch of FIG. 1 are both in a state of short circuit, and both the capacitors C1 and C2 are also hold a same low level, while the register A in which controls the two register reset signals of trigger control register and clock latch register is cleared out (timing 4) by signals 201 and 205 (timing 3). Once the rising edge of the trigger signal TG (103) is generated (timing 6), the trigger latch register B outputs a signal 202 (timing 6), and at the same time the trigger switch SW1 is opened so the capacitor C1 is charged by a current. After 30 to 50 ns, register C is enabled by timing 7 to 11, and the clock latch register is stimulated by the rising edge of the clock CL. The object of adding delay means D is to make the measuring range be within 30 to 130 ns, so that a smaller time period will not be measured and thereby assure that the circuit may function in a larger linear section of the signal. After the register C has actuated (timing 8), the switch SW2 is "ON", the C2 is begun to charge. After one period is lapsed, the registers B and C (timing 10) are reset by the reset register A (timing 9), and at the same time, the trigger switch SW1 and clock switch SW2 are closed, and the capacitor C1 and C2 stop charging. Tiny currents are held within the capacitors C1 and C2 through the reverse action of diodes, respectively, so to attain the object of a holding action. After the signal is amplified by a rear meter amplifier, it is converted by the analog to digital converter, and finally the signal is captured by other CPU, at which time, the signal 101 is returned to the low level (timing 12), which causes the signal 301 to be reduced to −2 V and capacitors C1 and C2 discharged (timing 13), the dotted lines representing the waveforms on the capacitors. The diodes D1, D2, D3 and D4 are used to ensure the timing described hereinbefore and to complete the function of sampling and holding.

Many changes and modifications in the above described embodiment of the invention can, of course, be carried out without departing from the scope thereof Accordingly, to promote the progress in science and the useful arts, the invention is disclosed and is intended to be limited only by the scope of the appended claims.

What is claimed is:

1. A differential mode time to digital converter, comprising:

- a logic control circuit for generating a control signal;
- first and second constant current sources;
- first and second symmetric capacitors with the same properties, said first symmetric capacitor being charged by a current from said first constant current source at a first timing determined by a clock signal, and said second symmetric capacitor being charged by a current from said second current source at a second timing different from the first timing, said second timing being determined by a trigger signal;
- a sample and hold circuit which is controlled by said logic control circuit;
- an amplifier; and
- an analog to digital converter for converting the output from said amplifier to a digital signal;
- wherein a voltage difference resulting from non-simultaneous charging of the capacitors is sampled and held by said sample and hold circuit and then amplified by said amplifier, and wherein said analog to digital converter is used to capture the corresponding relationship between said first and second timings in said digital signal.

2. A differential mode time to digital converter as claimed in claim 1, wherein the sample and hold circuit includes a plurality of diodes, and wherein the sampling and holding of said voltage are achieved by switching the diodes on and off.

3. A differential mode time to digital converter as claimed in claim 1, wherein said logic control circuit is includes a plurality of registers.

* * * * *